(12) United States Patent
Molina et al.

(10) Patent No.: US 12,407,357 B2
(45) Date of Patent: Sep. 2, 2025

(54) SYSTEM AND METHOD FOR CALIBRATING A TIME-INTERLEAVED DIGITAL-TO-ANALOG CONVERTER

(71) Applicant: Intel Corporation, Santa Clara, CA (US)

(72) Inventors: Albert Molina, Novelda (ES); Kameran Azadet, San Ramon, CA (US); Martin Clara, Santa Clara, CA (US); Daniel Gruber, St. Andrae (AT)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 17/645,785

(22) Filed: Dec. 23, 2021

(65) Prior Publication Data
US 2023/0208429 A1    Jun. 29, 2023

(51) Int. Cl.
*H03M 1/10*    (2006.01)

(52) U.S. Cl.
CPC ................................. *H03M 1/1014* (2013.01)

(58) Field of Classification Search
CPC .. H03M 1/0626; H03M 1/1033; H03M 1/662; H03M 1/0836; H03M 1/1009; H03M 1/1215; H03M 1/002; H03M 1/0614; H03M 1/0624; H03M 1/0629; H03M 1/0631; H03M 1/1014; H03M 1/1042; H03M 1/1052; H03M 1/1255; H03M 1/66; H03M 1/68; H03M 1/84; H03M 3/358; H03M 3/414; H03M 3/496; H03M 3/50
USPC .................................... 341/118–12, 144, 155
See application file for complete search history.

(56) References Cited

U.S. PATENT DOCUMENTS

| | | | |
|---|---|---|---|
| 8,660,170 B1 * | 2/2014 | Huynh ..................... | H03M 3/38 |
| | | | 375/224 |
| 8,773,296 B1 * | 7/2014 | Dusatko ................... | H03M 3/50 |
| | | | 341/143 |
| 9,130,586 B1 * | 9/2015 | Raz .......................... | H03M 1/662 |
| 9,379,728 B1 * | 6/2016 | Singh ....................... | H03M 1/1047 |
| 9,413,394 B1 * | 8/2016 | Lye ......................... | H04B 1/0014 |
| 9,577,657 B1 * | 2/2017 | Clara ....................... | H03M 1/109 |
| 10,461,764 B1 | 10/2019 | Paro Filho et al. | |
| 10,666,285 B1 * | 5/2020 | Mehdizad Taleie ........ | |
| | | | H03M 1/0626 |
| 2009/0052556 A1 * | 2/2009 | Fernandez ............. | H03M 1/662 |
| | | | 375/240 |

(Continued)

*Primary Examiner* — Linh V Nguyen
(74) *Attorney, Agent, or Firm* — 2SPL Patent Attorneys PartG mbB; Yong Beom Hwang (57) ABSTRACT

A system and method for calibrating a time-interleaved digital-to-analog converter (DAC). A calibration signal generator generates calibration data, and a time-interleaved DAC converts the calibration data to an analog calibration signal. An observation analog-to-digital converter (ADC) samples, and quantizes, the analog calibration signal filtered by an anti-alias filter. A mismatch estimation block estimates a frequency response mismatch between the sub-DACs and generates a sub-DAC mismatch correction factor based on an output of the observation ADC. The calibration signal generator applies the sub-DAC mismatch correction factor to the calibration data. The mismatch estimation block may estimate a DC offset mismatch between the sub-DACs based on the output of the observation ADC and generates a DC offset correction factor, and the calibration signal generator applies the DC offset correction factor to the calibration data.

20 Claims, 7 Drawing Sheets

(56) References Cited

U.S. PATENT DOCUMENTS

2012/0176190 A1* 7/2012 Goodman ........... H03M 1/1052
                                                    327/551
2019/0190530 A1* 6/2019 Rakuljic ............. H03M 1/1033
2019/0207616 A1* 7/2019 Chen ................... H03M 1/1014
2020/0212922 A1* 7/2020 Hovakimyan .......... H03F 3/189

* cited by examiner

SYSTEM AND METHOD FOR CALIBRATING A TIME-INTERLEAVED DIGITAL-TO-ANALOG CONVERTER

BACKGROUND

An efficient technique to compensate for the impairments of an analog component (such as a time-interleaved analog-to-digital converter (ADC)) is to use a digital equalizer. To train the digital equalizer, a bandlimited calibration signal needs to be generated and fed to the analog system under test and the output needs to be sampled by an ADC. A time-interleaved ADC could be viewed as an analog system with linear and nonlinear impairments followed by an ideal ADC.

Generating a bandlimited calibration signal using a digital-to-analog converter (DAC) has an advantage of flexibility. For instance, it is possible to generate calibration signals of different amplitudes and bandwidths with a DAC. The problem with using a DAC is that it generates images at multiples of the DAC sampling rate. If these images are not removed, then when the ADC samples the calibration signal, the response of the system to be corrected at those images will fall on top of the response of the system at the desired frequencies introducing an error in the calibration process.

If the maximum frequency ($f_{max}$ of the input analog signal to an ADC is close to $f_{adc}/2$ ($f_{adc}$ being a sampling frequency of the ADC), a very sharp anti-alias filter is needed at the output of the calibration DAC. Accurate high-order on-chip LC-filters are hard to implement, take up considerable silicon area, and suffer from significant losses, especially in on-chip implementations. Moreover, if ADC operation (and calibration) at different sampling rates ($f_{adc}$) is desired, multiple filters may be needed with RF multiplexing function. This option would require even more silicon area, as well as a difficult implementation for the RF multiplexer. Alternatively, a single tunable LC-filter may be used, but it would be only possible within a narrow frequency range.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
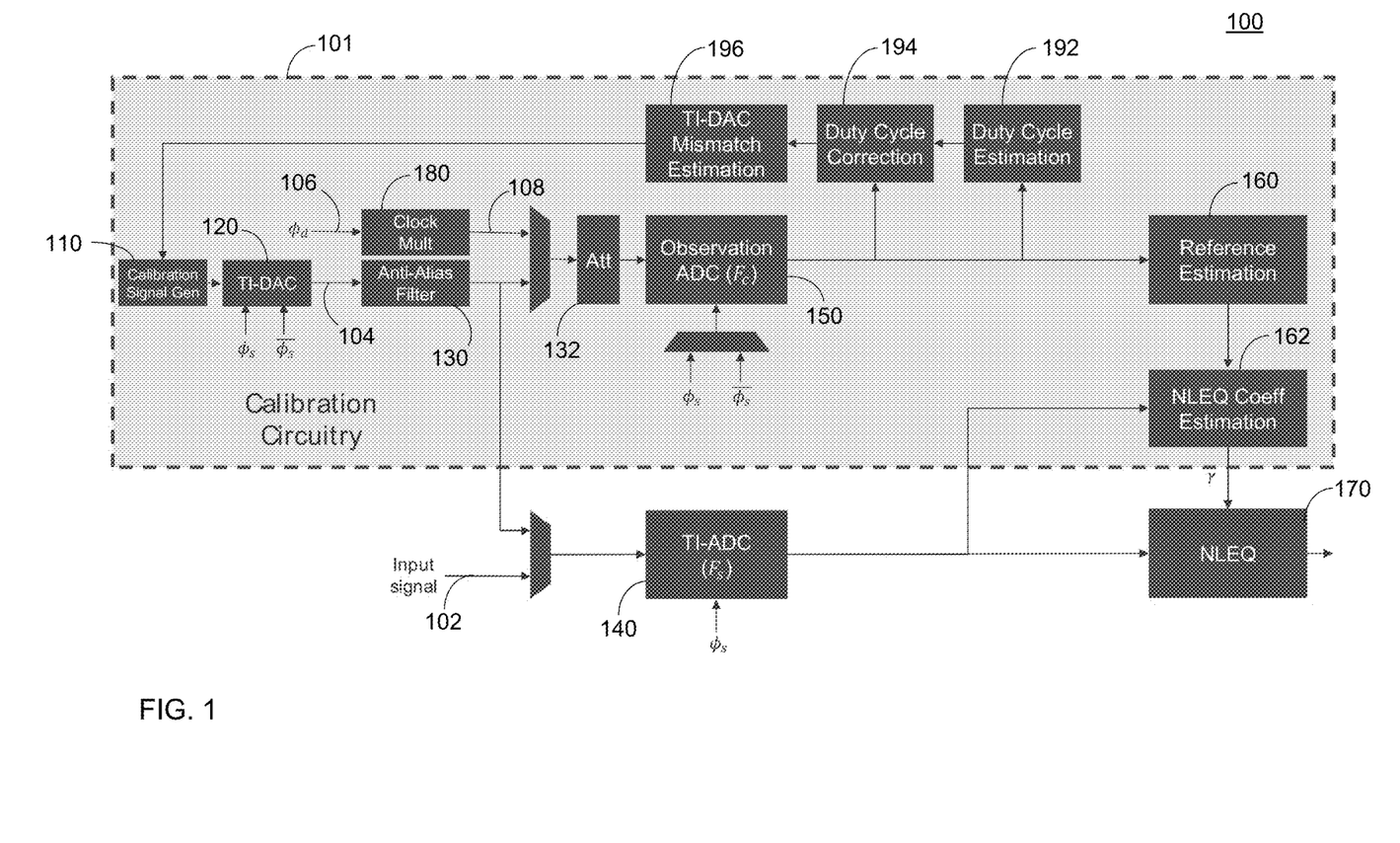
FIG. 1 shows an example system for analog-to-digital conversion including calibration circuitry.

FIG. 1 shows an example system 100 for analog-to-digital conversion including calibration circuitry 101. The calibration circuitry 101 is provided for calibration of an ADC 140 in this example. Alternatively, the system under calibration may be any system other than the ADC 140. Hereafter, the examples will be explained with reference to a case that the calibration circuitry 101 is used for calibration of the ADC 140. However, it should be noted that the calibration circuitry 101 may be used for calibration of any system (that may be referred to as a main system). The ADC 140 (a main ADC) converts the analog input signal 102 to a digital signal. The ADC 140 may be a time-interleaved ADC (TI-ADC) or a different type of ADC.

Figure 2:
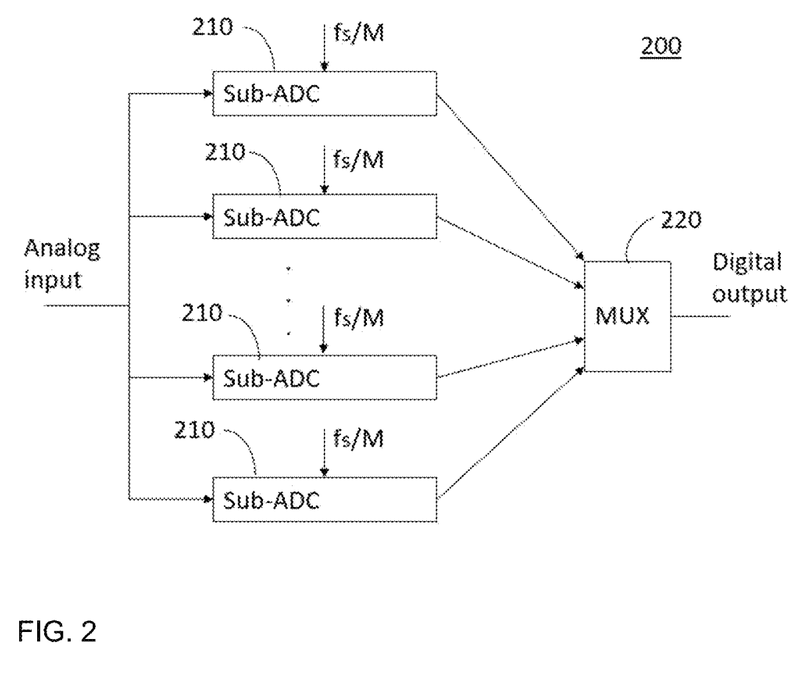
FIG. 2 shows an example time-interleaved ADC.

Time-interleaving of ADCs is a way to increase the overall system sampling rate by using several ADCs (sub-ADCs) in parallel. FIG. 2 shows an example TI-ADC 200. The TI-ADC 200 includes a plurality of sub-ADCs 210 (M sub-ADCs) coupled in parallel. Each sub-ADC 210 operates at sampling frequency (f/M) and the overall sampling frequency of the TI-ADC 200 is $f_s$. Each sub-ADC 210 samples the analog input signal at different time instances and the outputs of the sub-ADCs 210 are multiplexed by a multiplexer 220.

An ADC 140 is a non-linear device that can incur some linear and/or non-linear distortions on the outputs of the ADC 140. To compensate for the impairments of the ADC 140 (more generally, any linear or non-linear system), a digital equalizer 170 (e.g., a non-linear equalizer (NLEQ))

may be used. The digital equalizer 170 processes an output of the ADC 140 to remove/reduce a linear and/or non-linear distortion incurred by the ADC 140. The digital equalizer 170 may be a digital non-linear filter, e.g., a polynomial or Volterra filter, or a linear filter, e.g., a finite impulse response (FIR) filter or an infinite impulse response (IIR) filter.

To train the digital equalizer 170, a bandlimited calibration signal 104 (e.g., a periodic signal) is generated by a calibration DAC 120 and fed to the ADC 140. The calibration signal generator 110 generates digital calibration data, and the calibration DAC 120 converts the digital calibration data to an analog calibration signal 104. The analog calibration signal 104 may be filtered by the anti-alias filter 130 and then injected into the ADC 140 and to the observation ADC 150.

Generating a bandlimited signal (i.e., a calibration signal) using a DAC has an advantage of flexibility. For instance, calibration signals of different amplitudes and bandwidths can be generated with a DAC. However, the problem with using a DAC that operates at the same rate as the ADC 140 in generating the bandlimited calibration signal is that the DAC generates images at multiples of the DAC sampling rate. If the images are not removed, then when the ADC samples the calibration signal, the response of the system to be corrected at those images will fall on top of the response of the system at the desired frequencies introducing an error in the calibration process.

In examples, a time-interleaved DAC (TI-DAC) is used as the calibration DAC 120 to generate the analog calibration signal 104. A TI-DAC includes two or more sub-DACs and the delayed (time-interleaved) output signals of the two or more sub-DACs are summed such that a higher overall sampling rate is achieved.

Figure 3:
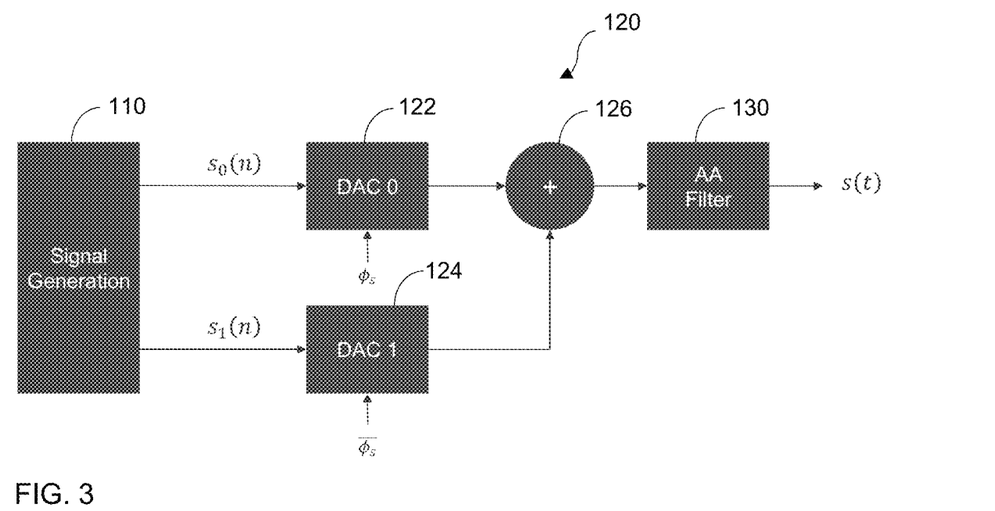
FIG. 3 shows an example time-interleaved DAC including two sub-DACs.

FIG. 3 shows an example time-interleaved DAC 120 including two sub-DACs 122, 124. The calibration signal generator 110 generates and supplies digital calibration data to the sub-DACs 122, 124, and each sub-DAC 122, 124 generates a corresponding output at a different time instant and the outputs of the sub-DACs 122, 124 are summed by a combiner 126. The summed output is then filtered by an anti-aliasing filter 130. Each sub-DAC 122, 124 may operate at a sampling rate $F_s$ (the sampling rate of the main ADC 140). In examples, one sub-DAC 122 (e.g., DAC 0) may be clocked by the ADC sampling clock at $F_s$ and the other sub-DAC 124 (e.g., DAC 1) may be clocked by the inverted ADC sampling clock at $F_s$. The clock going to one sub-DAC is the inverse of the clock going to the other sub-DAC. By using the 2× time-interleaved DAC 120, the image frequencies of the time-interleaved DAC 120 are at multiples of twice the non-interleaved DAC rate and hence are easier to remove by filtering.

The analog calibration signal 104 may be attenuated by the attenuator 132 and sampled and quantized by the observation ADC 150. The observation ADC 150 converts (samples) the analog calibration signal to a digital domain. The reference estimation circuitry 160 generates a reference signal from the sampled calibration signals for adaptive equalization of the ADC 140. The NLEQ coefficient estimation circuitry 162 is configured to generate coefficients for the digital equalizer 170 based on the reference signal (i.e., the reference data recovered via the observation ADC 150 and the reference estimation circuitry 160, or alternatively the digital reference data) and the output of the ADC 140. Any conventional digital adaptation algorithm may be used for the NLEQ coefficient estimation, e.g., a least mean square (LMS), recursive least square (RLS), etc. The digital equalizer 170 processes the output of the ADC 140 based on the coefficients received from the NLEQ coefficient estimation circuitry 162.

With a time-interleaved DAC 120 (TI-DAC) used to generate the analog calibration signal 104, there is a mismatch problem between the sub-DACs 122, 124. In examples, the mismatch between the sub-DACs 122, 124 may be estimated by the mismatch estimation block 196 based on the outputs of the observation ADC 150. The duty cycle estimation and correction may also be performed by the duty cycle correction block 194 and the duty cycle estimation block 192 to correct impairments due to clock skew of the observation ADC 150, which will be explained in detail below.

Figure 7:
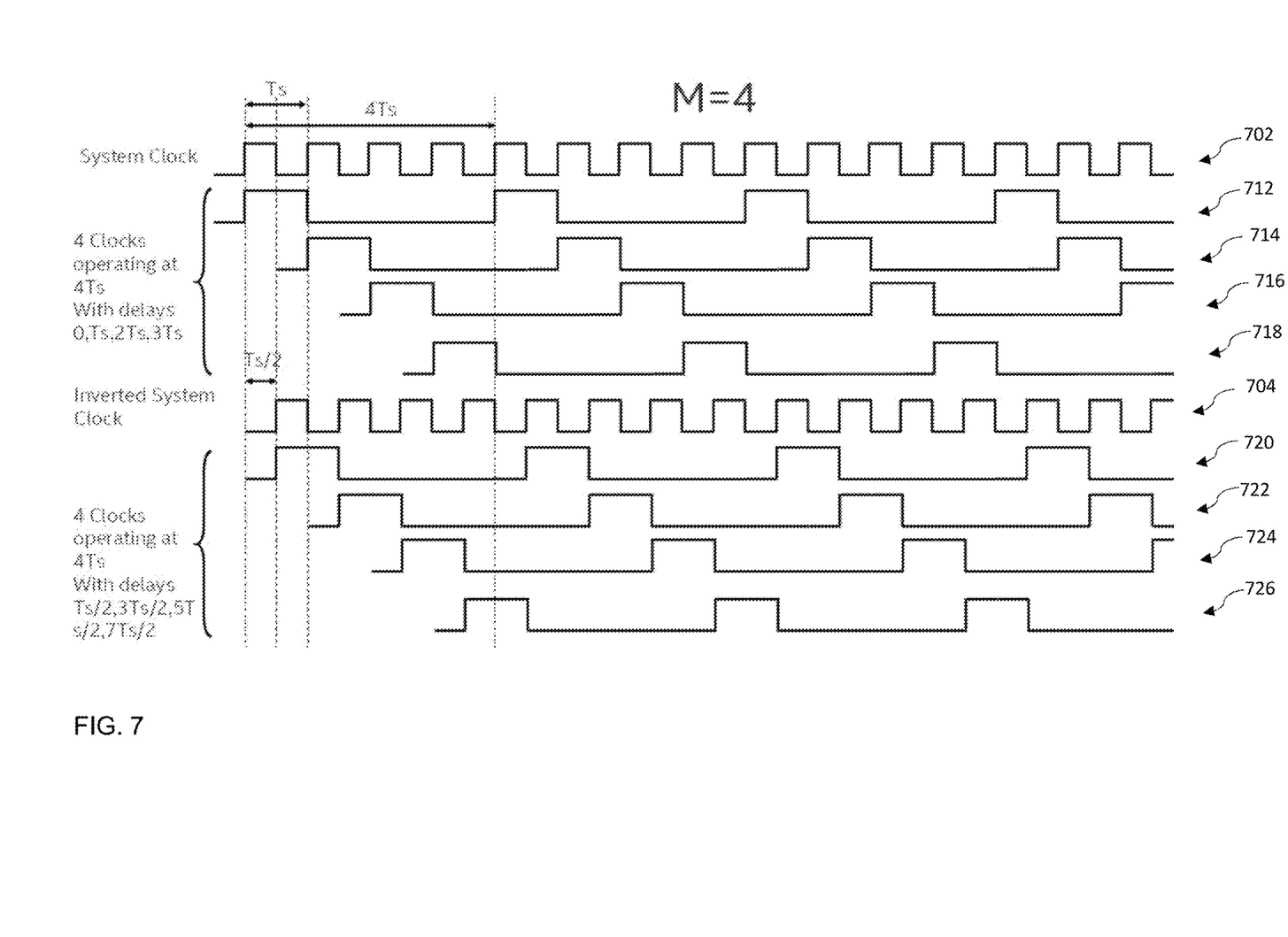
FIG. 7 shows an example of generating lower-rate clocks at different phases based on a sampling clock and an inverted sampling clock.

The observation ADC 150 may capture the analog calibration signal 104 (e.g., a periodic signal) at an effective rate of $2F_s$ ($F_s$ being the sampling frequency of the ADC 140, or an operating frequency of a main system, in general). The observation ADC 150 may be a low-rate ADC (e.g., additional sub-ADC of a TI-ADC operating at $F_s$) operating at $F_s=F_s/M$, where M is the interleaving factor of the TI-ADC. To generate the samples with a resolution of $T_s/2$ (i.e., the effective rate of $2F_s$), the observation ADC 150 may be clocked by the ADC sampling clock ($\phi_s$) and the inverted ADC sampling clock ($\overline{\phi_s}$) and 2M lower-rate clocks ($F_c=F_s/M$) at different phases may be generated by using the system clock and the inverted system clock to effectively sample the analog calibration signal at all of its phases at $2F_s$. FIG. 7 shows an example of generating 2M lower-rate clocks 712-726 at different phases in case of M=4. The observation ADC 150 may be clocked by the system clock 702 ($F_s$) and the inverted system clock 704 ($F_s$), and generate 8 (i.e., =2M) lower-rate clocks 712-726 (at $F_s/4$ in this example) at different phases for the effective combined sampling rate of $2F_s$ based on the system clock 702 and the inverted system clock 704. Each of the lower-rate clocks 712-726 has a different phase. The observation ADC 150 samples the analog calibration signal 104 using the 8 lower-rate clocks 712-726 (one at a time and cycling through all the lower-rate clocks 712-726) and combine the samples generated for different phases to effectively sample the analog calibration signal 104 at $2F_s$. In this case, if the ADC sampling clock does not have a 50% duty cycle, the duty cycle skew may occur. The duty cycle skew and the impairments due to the duty cycle skew needs to be estimated and corrected by the duty cycle estimation block 192 and the duty cycle correction block 194. For this purpose, a filtered clock signal 108 at the rate of $F_s$ K/M may be fed into the observation ADC 150, which will be explained in detail below. The TI-DAC mismatch estimate block 196 estimates the mismatch correction factor and sends it to the calibration signal generator 110. The calibration signal generator then applies the correction factor to the calibration data in a digital domain.

The process for TI-DAC mismatch correction and observation ADC clock duty cycle skew estimation and correction are explained below.

The train of pulses is periodic, and it can be represented as a Fourier series as follows:

$$\sum_{n=-\infty}^{\infty} \delta(t - nT_s) = \frac{1}{T_s} \sum_{n=-\infty}^{\infty} e^{j\frac{2\pi}{T_s}nt}. \qquad \text{Equation (1)}$$

The outputs of the first sub-DAC 122 (DAC 0 in FIG. 3) and the second sub-DAC 124 (DAC 1 in FIG. 3) may be written as follows:

$$s_0(t) = p_0(t) * \left((d_0 + s(t))\sum_{n=-\infty}^{\infty} \delta(t - nT_s)\right), \text{ and} \quad \text{Equation (2)}$$

$$s_1(t) = \quad \text{Equation (3)}$$
$$p_1(t) * \left((d_1 + s(t - T_{skew}))\sum_{n=-\infty}^{\infty} \delta\left(t - nT_s - \frac{T_s}{2} - T_{skew}\right)\right).$$

where $p_0(t)$ and $p_1(t)$ are the pulse shapes of DAC 0 and DAC 1, respectively. The anti-alias filter impulse response is assumed to be included in $p_0(t)$ and $p_1(t)$. $d_0$ and $d_1$ are the DC offsets for DAC 0 and DAC 1, respectively, and $s_0(t)$ and $s_1(t)$ are the desired output waveforms of DAC 0 and DAC 1, respectively. $T_{skew}$ is the clock skew between the clocks to DAC 0 and DAC 1. $T_s$ is the sampling period of DAC 0 and DAC 1.

The outputs of the DAC 0 and DAC 1 in the frequency domain may be written as:

$$S_0(f) = \frac{1}{T_s} P_0(f) \sum_{n=-\infty}^{\infty} (d_0 \delta(f - nF_s) + S(f - nF_s)), \quad \text{Equation (4)}$$

$$S_1(f) = \quad \text{Equation (5)}$$
$$\frac{1}{T_s} P_1(f) e^{-j2\pi f T_{skew}} \sum_{n=-\infty}^{\infty} e^{-j\pi n} (d_1 \delta(f - nF_s) + S(f - nF_s)).$$

The clock skew $T_{skew}$ could be combined with the frequency response of $P_1(f)$. The outputs of the two sub-DACs (DAC 0 and DAC 1) are added as follows:

$$S_{dac}(f) = S_0(f) + S_1(f) = \quad \text{Equation (6)}$$
$$\frac{1}{T_s} \sum_{n=-\infty}^{\infty} \left(P_0(f) + (-1)^n P_1(f) e^{-j2\pi f T_{skew}}\right) S(f - nF_s) +$$
$$\frac{1}{T_s} \sum_{n=-\infty}^{\infty} \left(d_0 P_0(f) + (-1)^n d_1 P_1(f) e^{-j2\pi f T_{skew}}\right) \delta(f - nF_s).$$

The first step in TI-DAC calibration is to correct the frequency response mismatch between the two sub-DACs 122, 124. Example solution for the correction of the mismatch is described below. However, it should be noted that the solution described below is just one example and other solutions may be utilized to implement the calibration procedure.

Since the calibration signal (a reference signal) is generally periodic, its spectrum is discrete, and it is sufficient to consider how to calibrate the TI-DAC 120 for one frequency. This procedure may then be repeated for all frequencies occupied by the calibration signal. Consider a sinewave used as the calibration signal as follows:

$$s(t) = A_s \sin(2\pi f_c t + \phi_s), \quad \text{Equation (7)}$$

$$S(f) = \frac{A_s}{2j} (\delta(f - f_c) e^{j\phi_s} - \delta(f + f_c) e^{-j\phi_s}). \quad \text{Equation (8)}$$

The output of the TI-DAC 120 for a sinewave input is written as follows:

$$S_{dac}(f) = \frac{1}{T_s} \frac{A_s}{2j} \quad \text{Equation (9)}$$
$$\sum_{n=-\infty}^{\infty} \left[\left(P_0(nF_s + f_c) + (-1)^n P_1(nF_s + f_c) e^{-j2\pi(nF_s + f_c)T_{skew}}\right)\right.$$
$$\delta(f - f_c - nF_s) e^{j\phi_s} - \left(P_0(nF_s - f_c) +\right.$$
$$\left.(-1)^n P_1(nF_s - f_c) e^{-j2\pi(nF_s - f_c)T_{skew}}\right) \delta(f + f_c - nF_s) e^{-j\phi_s}\right] +$$
$$\frac{1}{T_s} \sum_{n=-\infty}^{\infty} \left(d_0 P_0(nF_s) + (-1)^n d_1 P_1(nF_s) e^{-j2\pi f T_{skew}}\right)$$
$$\delta(f - nF_s).$$

It is assumed that the TI-DAC anti-aliasing filters 130 remove components above $F_s$. The TI-DAC anti-alias filter output is sampled by the observation ADC 150 effectively sampling at $2F_s$, so that the spectrum can be evaluated at positive frequencies in the range $0 < f_c < F_s$. The only two components at the output of the anti-alias filter 130 are for n=0 and 1.

For n=0, $$S_{dac}(f_c) = \frac{1}{T_s} \frac{A_s}{2j} \left(P_0(f_c) + P_1(f_c) e^{-j2\pi f_c T_{skew}}\right) \delta(0) e^{j\phi_s}. \quad \text{Equation (10)}$$

For n=1, $$S_{dac}(F_s - f_c) = \quad \text{Equation (11)}$$
$$\frac{1}{T_s} \frac{A_s}{2j} \left(-P_0(F_s - f_c) + P_1(F_s - f_c) e^{-j2\pi(F_s - f_c)T_{skew}}\right) \delta(0) e^{-j\phi_s}.$$

The aim is to cancel the undesired image frequency (n=1). One example scheme is explained below.

First, the calibration signal is sent on DAC 0 only, and the output of the DAC 120 after anti-aliasing filter 130 is as follows:

$$S_{dac}^{(0)}(F_s - f_c) = \frac{1}{T_s} \frac{A_s}{2j} (-P_0(F_s - f_c)) \delta(0) e^{-j\phi_s}. \quad \text{Equation (12)}$$

Next, the calibration signal is sent on DAC 1 only, and the output of the DAC 120 after anti-aliasing filter 130 is as follows:

$$S_{dac}^{(1)}(F_s - f_c) = \frac{1}{T_s} \frac{A_s}{2j} \left(P_1(F_s - f_c) e^{-j2\pi(F_s - f_c)T_{skew}}\right) \delta(0) e^{-j\phi_s}. \quad \text{Equation (13)}$$

The DAC 1 correction factor $C_1$ is obtained as follows:

$$C_1 = \frac{-S_{dac}^{(0)}(F_s - f_c)}{S_{dac}^{(1)}(F_s - f_c)} = \frac{P_0(F_s - f_c)}{P_1(F_s - f_c) e^{-j2\pi(F_s - f_c)T_{skew}}}. \quad \text{Equation (14)}$$

The calibration signal tone for DAC 1 is corrected as follows:

$$s_1(t) = A_s |C_1| \sin(2\pi f_c t + \phi_s - \angle C_1). \quad \text{Equation (15)}$$

The DAC 1 correction factor $C_1$ is estimated by the TI-DAC mismatch estimation block 196 and sent to the calibration signal generator 110, and the calibration signal generator applies the correction factor to the calibration signal for DAC 1 as in Equation (15).

The second step in TI-DAC mismatch calibration is to correct the DC offset mismatch between the two sub-DACs 122, 124 (DAC 0 and DAC 1). For a DC value, $$s(t)=A_{dc}, \quad \text{Equation (16)}$$

$$S(f)=A_{dc}\delta(f). \quad \text{Equation (17)}$$

The output of the TI-DAC 120 for a DC input may be written as follows:

$$S_{dac}(f) = \frac{1}{T_s}\sum_{n=-\infty}^{\infty} \quad \text{Equation (18)}$$

$$\left((d_o + A_{ac})P_0(f) + (-1)^n(d_1 + A_{ac})P_1(f)e^{-j2\pi fT_{skew}}\right)$$

$$\delta(f - nF_s).$$

After the anti-alias filter 130, frequency components of the DAC output at f=0 and f=$F_s$ can be written as follows.

$$S_{dac}(0) = \frac{1}{T_s}((d_o + A_{ac})P_0(0) + (d_1 + A_{ac})P_1(0))\delta(0), \quad \text{Equation (19)}$$

$$S_{dac}(F_s) = \quad \text{Equation (20)}$$
$$\frac{1}{T_s}\left((d_o + A_{ac})P_0(F_s) - (d_1 + A_{ac})P_1(F_s)e^{-j2\pi F_s T_{skew}}\right)\delta(F_s).$$

Assume that the nominal pulse shape is a zero-order hold with a frequency response as follows:

$$P(f) = T_s\,\mathrm{sinc}\!\left(\frac{\pi f}{F_s}\right)e^{-j\pi fT_s}. \quad \text{Equation (21)}$$

For this response, there is a zero at $F_s$. Hence, it is only needed to consider correcting for the effects of DC-offset and gain mismatch at 0 Hz. A different procedure may be implemented for other pulse shapes.

For estimating the DC offset in DAC 0, DAC 1 is disabled, and the calibration signal is set as $A_{dc}$=0, and the output of the observation ADC 150 is written as:

$$S_{dac}^{(0,0)}(0) = \frac{1}{T_s}d_0 P_0(0)\delta(0). \quad \text{Equation (22)}$$

Then, while DAC 1 is disabled, the calibration signal is injected, and the output of the observation ADC 150 is written as:

$$S_{dac}^{(0)}(0) = \frac{1}{T_s}(d_0 + A_{dc})P_0(0)\delta(0). \quad \text{Equation (23)}$$

The DC offset of DAC 0 is estimated as:

$$\frac{s_{dac}^{(0,0)}(0)}{s_{dac}^{(0)}(0) - s_{dac}^{(0,0)}(0)}A_{dc} = d_0. \quad \text{Equation (24)}$$

For estimating the DC offset in DAC 1, DAC 0 is disabled, and the calibration signal is set as $A_{dc}$=0, and the output of the observation ADC 150 is written as:

$$S_{dac}^{(1,0)}(0) = \frac{1}{T_s}d_1 P_1(0)\delta(0). \quad \text{Equation (25)}$$

Then, while DAC 0 is disabled, the calibration signal is injected, and the output of the observation ADC 150 is written as:

$$S_{dac}^{(1)}(0) = \frac{1}{T_s}(d_1 + A_{dc})P_1(0)\delta(0). \quad \text{Equation (26)}$$

The DC offset for DAC 1 is estimated as:

$$\frac{s_{dac}^{(1,0)}(0)}{s_{dac}^{(1)}(0) - s_{dac}^{(1,0)}(0)}A_{dc} = d_1. \quad \text{Equation (27)}$$

The difference in DC gain between DAC 0 and DAC 1 is estimated as:

$$D_1 = \frac{s_{dac}^{(0)}(0) - s_{dac}^{(0,0)}(0)}{s_{dac}^{(1)}(0) - s_{dac}^{(1,0)}(0)} = \frac{P_0(0)}{P_1(0)}. \quad \text{Equation (28)}$$

The correction scheme is to send $s_0(t)$ and $s_1(t)$ to DAC 0 and DAC 1, respectively as follows:

$$s_0(t)=A_{dc}-d_0, \quad \text{Equation (29)}$$

$$s_1(t)=A_{dc}D_1-d_1. \quad \text{Equation (30)}$$

The DC offset correction factor $D_1$ is estimated by the TI-DAC mismatch estimation block 196 and sent to the calibration signal generator 110, and the calibration signal generator 100 applies the DC offset correction factor to the calibration signal for DAC 1 as in Equation (30).

Example schemes for correcting the impairments due to the clock skew where the observation ADC 150 is clocked by the sampling clock and the inverted sampling clock are explained hereafter.

The observation ADC 150 may be a low-rate ADC (e.g., a sub-ADC of a TI-ADC operating at $F_s$) operating at $F_c=F_s/M$, where M is the interleaving factor of the TI-ADC for the case where a TI-DAC is used for the calibration of a TI-ADC. To generate the samples with a resolution of $T_s/2$, the observation ADC 150 may be clocked by the ADC sampling clock ($\phi_s$) and the inverted ADC sampling clock ($\overline{\phi_s}$) and sample the analog calibration signal using multiple lower-rate clocks with different phases generated based on the ADC sampling clock and the inverted ADC sampling clock, as explained above. In this case, if the ADC sampling clock does not have a 50% duty cycle, there would be a duty cycle skew. The duty cycle skew and the impairments due to the duty cycle skew needs to be estimated and corrected. For this purpose, in some examples, a filtered clock 108 at $F_s \cdot K/M$ may be fed into the observation ADC 150.

Since the calibration signal is periodic, the complete signal may be captured by capturing 2M phases of the signal. The sampling instances are as follows:

$$r_n^{(m)} = (n2M + m)\frac{T_s}{2}, 0 \le m \le 2M - 1. \quad \text{Equation (31)}$$

The even phases (m=0, 2, ... 2M−2) are generated from the non-inverted clock running at $F_s$, $$re_n^{(m_e)} = (nM+m_e)T_s, 0 \le m_e \le M-1. \quad \text{Equation (32)}$$

The odd phases (m=1, 3, ... 2M−1) are generated from the inverse of the clock used for the even samples. Since the duty-cycle of the clock may not be 50%, there may be a skew ($T_{dc}$) in the odd-phase sampling instances.

$$ro_n^{(m_o)} = (nM + m_o)T_s + \frac{T_s}{2} + T_{dc}, 0 \le m_o \le M - 1. \quad \text{Equation (33)}$$

In some examples, to estimate the skew $T_{dc}$, an approximation to a sine wave may be injected into the observation ADC 150. For example, a system clock ($\phi_d$) 106 (e.g., a clock at $F_s/M$) may be filtered to generate an approximation to a sine wave and passed through a clock multiplier 180 to generate a tone at a rate of $F_sK/M$, where integers K and M are coprime. The reason for multiplying the clock frequency by K is that in practice the filtered system clock 106 will contain harmonics of its clock rate. If the sampling rate of the observation ADC 150 is a multiple of the input signal clock rate, then some of the higher order harmonics above $F_s/2$ will fold on top of the desired input tone distorting the measurement. For the analysis below, a discrete Fourier transform (DFT) of the input waveform is computed and just the fundamental frequency is considered. Hence, it is assumed in the analysis that the input is just a sine wave.

Let the input signal to the observation ADC 150 be as follows:

$$p(t) = A \cos\left(2\pi \frac{F_sK}{M} t + \theta\right). \quad \text{Equation (34)}$$

The even samples by the observation ADC 150 are written as follows:

$$pe_n = p(nT_s) = A \cos\left(2\pi \frac{K}{M} n + \theta\right). \quad \text{Equation (35)}$$

The odd samples by the observation ADC 150 are written as follows:

$$po_n = \quad \text{Equation (36)}$$
$$p\left(nT_s + \frac{T_s}{2} + T_{dc}\right) = A\cos\left(2\pi \frac{K}{M} n + 2\pi \frac{F_sK}{M}\left(\frac{T_s}{2} + T_{dc}\right) + \theta\right).$$

M samples are captured from the even and odd streams, respectively (n=0M−1) and then their DFTs are computed.

$$pe_n = A \cos\left(\frac{2\pi}{M} Kn + \theta\right), \quad \text{Equation (37)}$$

$$PE_k = \frac{M}{2}\left(Ae^{j\theta}\delta_{k-K} + Ae^{-j\theta}\delta_{k-M+K}\right), \quad \text{Equation (38)}$$

$$PO_k = \quad \text{Equation (39)}$$
$$\frac{M}{2}\left(Ae^{j\left(2\pi \frac{F_sK}{M}\left(\frac{T_s}{2}+T_{dc}\right)+\theta\right)}\delta_{k-K} + Ae^{-j\left(2\pi \frac{F_sK}{M}\left(\frac{T_s}{2}+T_{dc}\right)+\theta\right)}\delta_{k-M+K}\right).$$

The skew $T_{dc}$ may be estimated from the values of the DFT at k=K as follows:

$$PE_k = \frac{M}{2}Ae^{j\theta}, \quad \text{Equation (40)}$$

$$PO_K = \frac{M}{2}Ae^{j\left(2\pi \frac{F_sK}{M}\left(\frac{T_s}{2}+T_{dc}\right)+\theta\right)}, \quad \text{Equation (41)}$$

$$T_{dc} = \frac{\angle\left(\frac{PO_K}{PE_K}\right) - \pi\frac{K}{M}}{2\pi\frac{F_sK}{M}}. \quad \text{Equation (42)}$$

Once the skew $T_{dc}$ is estimated, the captured odd samples may be corrected as follows. Let the captured samples at $2F_s$ be $s_n$, where n=0, 1, ..., N−1

$$DFT_N(s_n) = S_k = \sum_{n=0}^{N-1} s_n e^{j\frac{2\pi}{N}kn}, \quad \text{Equation (43)}$$

$$S_k = \sum_{n=0}^{N/2-1} s_{2n} e^{j\frac{2\pi}{N}k2n} + \sum_{n=0}^{N/2-1} s_{2n+1} e^{j\frac{2\pi}{N}k(2n+1)}, \quad \text{Equation (44)}$$

$$S_k = \sum_{n=0}^{N/2-1} s_{2n} e^{j\frac{2\pi}{N}k2n} + e^{j\frac{2\pi}{N}k}\sum_{n=0}^{N/2-1} s_{2n+1} e^{j\frac{2\pi}{N}k2n}, \quad \text{Equation (45)}$$

$$S_k = DFT_{N/2}(se_n) + e^{j\frac{2\pi}{N}k}DFT_{N/2}(so_n). \quad \text{Equation (46)}$$

The corrected signal is as follows:

$$S_k = DFT_{N/2}(se_n) + e^{j\frac{2\pi}{N}k}DFT_{N/2}(so_n)e^{j\frac{2\pi}{N}k\frac{T_{dc}}{T_s}}. \quad \text{Equation (47)}$$

The duty cycle estimation block 192 estimates the skew $T_{dc}$ as in Equation (42), and the duty cycle correction block 194 corrects the output of the observation ADC 150 as in Equation (47). The TI-DAC mismatch estimation block 196 may then estimate the DAC 1 correction factor $C_1$ and the DC offset correction factor $D_1$ based on the clock skew corrected output from the duty cycle correction block 194. If the duty cycle estimation/correction due to clock skew is not implemented, the duty cycle estimation and correction blocks 192, 194 are bypassed and the TI-DAC mismatch estimation block 196 may estimate the correction factor $C_1$ and the DC offset correction factor $D_1$ based on the output of the observation ADC 150.

Figure 4:
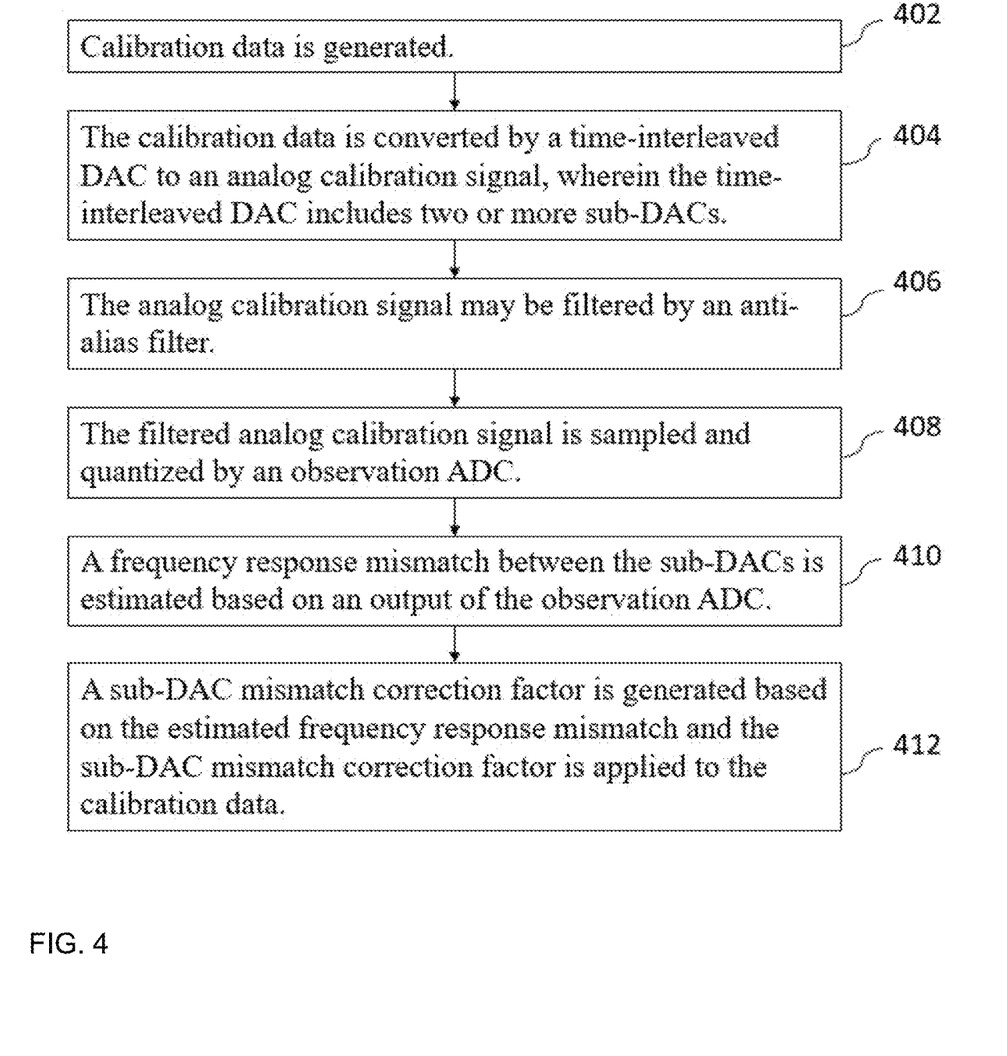
FIG. 4 is a flow diagram of an example process for calibrating a time-interleaved DAC.

FIG. 4 is a flow diagram of an example process for calibrating a time-interleaved DAC. The method includes generating calibration data (402). The calibration data is converted by a time-interleaved DAC to an analog calibration signal, wherein the time-interleaved DAC includes two or more sub-DACs (404). The analog calibration signal may be filtered by an anti-alias filter (406). The filtered analog calibration signal is then sampled and quantized by an observation ADC (408). A frequency response mismatch between the sub-DACs is then estimated based on an output of the observation ADC (410). A sub-DAC mismatch correction factor is generated based on the estimated frequency response mismatch and the sub-DAC mismatch correction factor is applied to the calibration data (412).

The method may further include estimating a DC offset mismatch between the sub-DACs based on the output of the observation ADC, generating a DC offset correction factor based on the estimated a DC offset mismatch, and applying the DC offset correction factor to the calibration data.

The time-interleaved DAC may include two sub-DACs that are configured to operate using a sampling clock of a main ADC and an inverted sampling clock of the main ADC, respectively, and the observation ADC may be configured to sample the analog calibration signal at twice the sampling frequency of the main ADC using the sampling clock and the inverted sampling clock. The method may further include estimating a skew of the sampling clock and the inverted sampling clock based on the output of the observation ADC, and correcting an output of the observation ADC based on the estimated skew.

The main ADC may be a time-interleaved ADC including M sub-ADCs, wherein M is an interleaving factor of the time-interleaved ADC. The method may further include filtering a system clock signal, multiplying the filtered system clock signal with a factor K, and injecting the multiplied system clock signal into the observation ADC. The system clock signal may be at a fraction (1/M) of the sampling clock of the main ADC, and K and M are coprime, and the skew may be estimated based on samples of the multiplied system clock signal obtained by the observation ADC.

Figure 5:
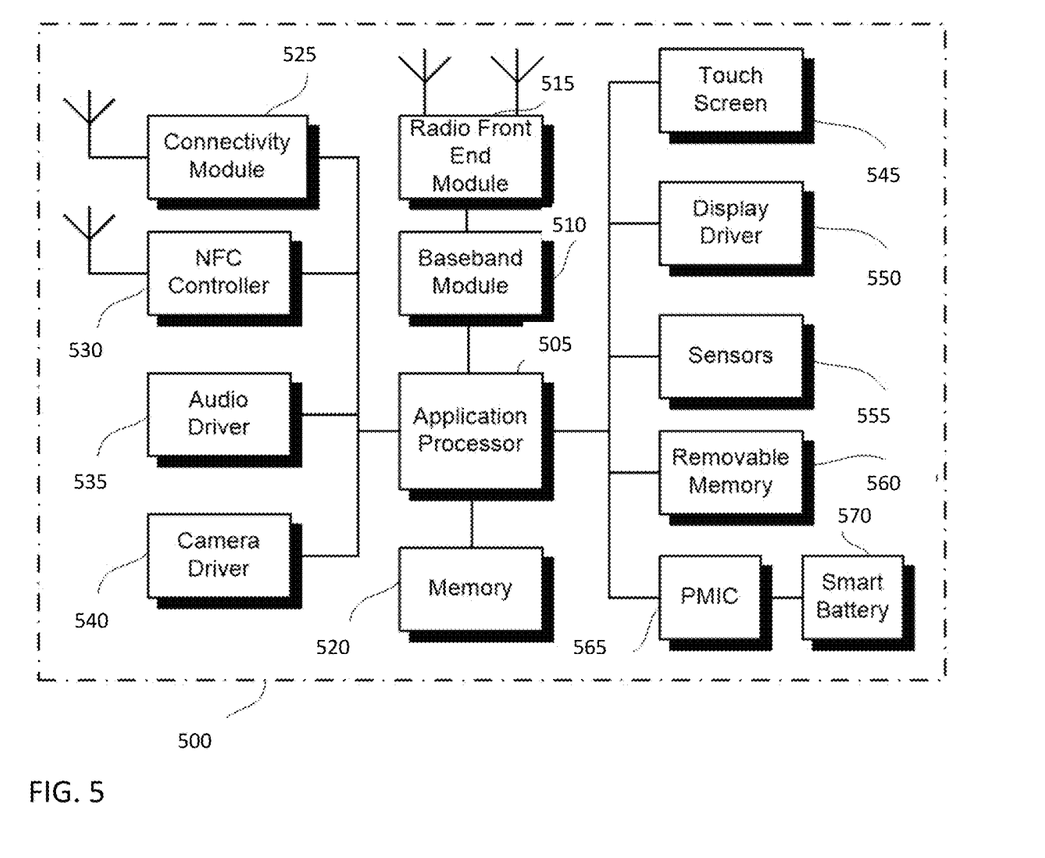
FIG. 5 illustrates a user device in which the examples disclosed herein may be implemented.

FIG. 5 illustrates a user device 500 in which the examples disclosed herein may be implemented. For example, the examples disclosed herein may be implemented in the radio front-end module 515, in the baseband module 510, etc. The user device 500 may be a mobile device in some aspects and includes an application processor 505, baseband processor 510 (also referred to as a baseband module), radio front end module (RFEM) 515, memory 520, connectivity module 525, near field communication (NFC) controller 530, audio driver 535, camera driver 540, touch screen 545, display driver 550, sensors 555, removable memory 560, power management integrated circuit (PMIC) 565 and smart battery 570.

In some aspects, application processor 505 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 510 may be implemented, for example, as a solder-down substrate including one or more integrated circuits, a single packaged integrated circuit soldered to a main circuit board, and/or a multi-chip module containing two or more integrated circuits.

Figure 6:
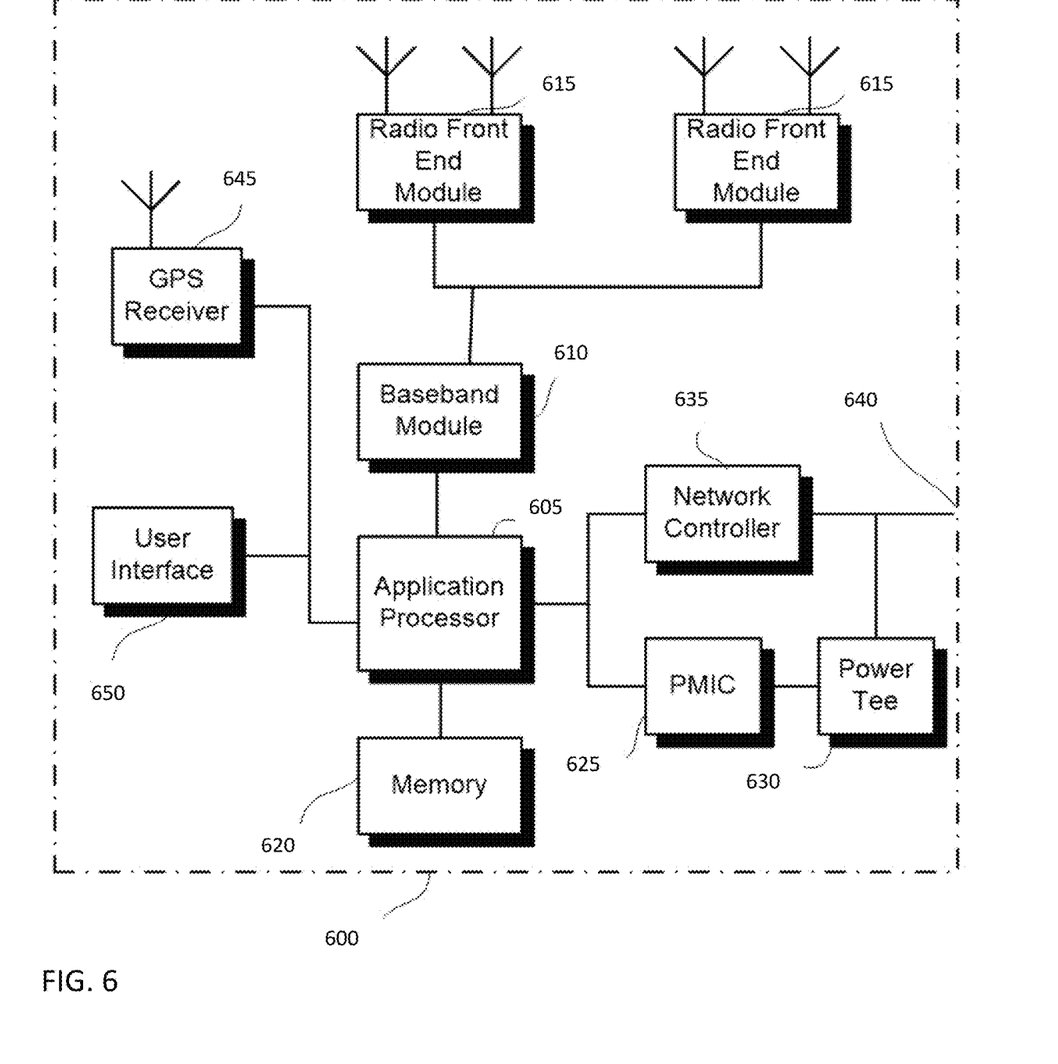
FIG. 6 illustrates a base station or infrastructure equipment radio head in which the examples disclosed herein may be implemented.

FIG. 6 illustrates a base station or infrastructure equipment radio head 600 in which the examples disclosed herein may be implemented. For example, the examples disclosed herein may be implemented in the radio front-end module 615, in the baseband module 610, etc. The base station radio head 600 may include one or more of application processor 605, baseband modules 610, one or more radio front end modules 615, memory 620, power management circuitry 625, power tee circuitry 630, network controller 635, network interface connector 640, satellite navigation receiver module 645, and user interface 650.

In some aspects, application processor 605 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 610 may be implemented, for example, as a solder-down substrate including one or more integrated circuits, a single packaged integrated circuit soldered to a main circuit board or a multi-chip module containing two or more integrated circuits.

In some aspects, memory 620 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 620 may be implemented as one or more of solder down packaged integrated circuits, socketed memory modules and plug-in memory cards.

In some aspects, power management integrated circuitry 625 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 630 may provide for electrical power drawn from a network cable to provide both power supply and data connectivity to the base station radio head 600 using a single cable.

In some aspects, network controller 635 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 645 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 645 may provide data to application processor 605 which may include one or more of position data or time data. Application processor 605 may use time data to synchronize operations with other radio base stations.

In some aspects, user interface 650 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to a system for calibrating a time-interleaved DAC. The system includes a calibration signal generator configured to generate calibration data, a time-interleaved DAC configured to convert the calibration data to an analog calibration signal, wherein the time-interleaved DAC includes two or more sub-DACs, an anti-alias filter configured to filter the analog calibration signal, an observation ADC configured to sample, and quantize, the analog calibration signal filtered by the anti-alias filter, and a mismatch estimation block configured to estimate a frequency response mismatch between the sub-DACs and generate a sub-DAC mismatch correction factor based on an output of the observation ADC, wherein the calibration signal generator is configured to apply the sub-DAC mismatch correction factor to the calibration data.

Another example (e.g., example 2) relates to a previously described example (e.g., example 1), wherein the mismatch estimation block is configured to estimate a DC offset mismatch between the sub-DACs based on the output of the observation ADC and generate a DC offset correction factor, wherein the calibration signal generator is configured to apply the DC offset correction factor to the calibration data.

Another example (e.g., example 3) relates to a previously described example (e.g., any one of examples 1-2), wherein the time-interleaved DAC comprises two sub-DACs, and the two sub-DACs are configured to operate using a clock of a main system and an inverted clock of the main system, respectively.

Another example (e.g., example 4) relates to a previously described example (e.g., any one of examples 1-3), wherein the observation ADC is configured to effectively sample the analog calibration signal at twice a clock rate of a main system by using multiple lower-rate clocks with different phases that are generated based on a clock of the main system and an inverted clock of the main system.

Another example (e.g., example 5) relates to a previously described example (e.g., example 4), wherein the system further includes a duty cycle estimation block configured to estimate a skew of the clock and the inverted clock based on the output of the observation ADC, and a duty cycle correction block configured to correct an output of the observation ADC based on the estimated skew, wherein the mismatch estimation block is configured to estimate the frequency response mismatch and generate the sub-DAC mismatch correction factor based on an output of the duty cycle correction block.

Another example (e.g., example 6) relates to a previously described example (e.g., example 5), wherein the main system is a time-interleaved ADC including M sub-ADCs, wherein M is an interleaving factor of the time-interleaved ADC, and the observation ADC is an additional sub-ADC of the time-interleaved ADC, and the observation ADC is configured to effectively sample the analog calibration signal at twice a sampling frequency of the time-interleaved ADC by generating and using 2M lower-rate clocks with different phases based on a sampling clock of the time-interleaved ADC and an inverted sampling clock of the time-interleaved ADC.

Another example (e.g., example 7) relates to a previously described example (e.g., example 6), wherein the system further includes a clock multiplier configured to multiply a filtered clock signal with a factor K, wherein the multiplied clock signal is injected into the observation ADC and the filtered clock signal is at a fraction (1/M) of the sampling clock of the time-interleaved ADC, and K and M are coprime, wherein the duty cycle estimation block is configured to estimate the skew based on samples of the multiplied clock signal obtained by the observation ADC.

Another example (e.g., example 8) relates to an analog-to-digital conversion system, comprising a main ADC configured to convert an analog input signal to a digital signal, a digital equalizer configured to remove a distortion incurred by the main ADC from an output of the main ADC, an equalizer coefficient estimation block configured to generate coefficients for the digital equalizer, a calibration signal generator configured to generate calibration data, a time-interleaved DAC configured to convert the calibration data to an analog calibration signal, wherein the time-interleaved DAC includes two or more sub-DACs, an anti-alias filter configured to filter the analog calibration signal, an observation ADC configured to sample, and quantize, the analog calibration signal filtered by the anti-alias filter, and a mismatch estimation block configured to estimate a frequency response mismatch between the sub-DACs and generate a sub-DAC mismatch correction factor based on an output of the observation ADC, wherein the calibration signal generator is configured to apply the sub-DAC mismatch correction factor to the calibration data.

Another example (e.g., example 9) relates to a previously described example (e.g., example 8), wherein the mismatch estimation block is configured to estimate a DC offset mismatch between the sub-DACs based on the output of the observation ADC and generate a DC offset correction factor, wherein the calibration signal generator is configured to apply the DC offset correction factor to the calibration data.

Another example (e.g., example 10) relates to a previously described example (e.g., any one of examples 8-9), wherein the time-interleaved DAC comprises two sub-DACs, and the two sub-DACs are configured to operate using a sampling clock of the main ADC and an inverted sampling clock of the main ADC, respectively.

Another example (e.g., example 11) relates to a previously described example (e.g., any one of examples 8-10), wherein the observation ADC is configured to effectively sample the analog calibration signal at twice a sampling frequency of the main ADC by using multiple lower-rate clocks with different phases that are generated based on a sampling clock of the main ADC and an inverted sampling clock of the main ADC.

Another example (e.g., example 12) relates to a previously described example (e.g., example 11), wherein the system further includes a duty cycle estimation block configured to estimate a skew of the sampling clock and the inverted sampling clock based on the output of the observation ADC, and a duty cycle correction block configured to correct an output of the observation ADC based on the estimated skew.

Another example (e.g., example 13) relates to a previously described example (e.g., example 12), wherein the main ADC is a time-interleaved ADC including M sub-ADCs, wherein M is an interleaving factor of the time-interleaved ADC, and the observation ADC is an additional sub-ADC of the time-interleaved ADC, and the observation ADC is configured to effectively sample the analog calibration signal at twice the sampling frequency of the time-interleaved ADC by using multiple lower-rate clocks with different phases that are generated based on the sampling clock of the main ADC and the inverted sampling clock of the main ADC.

Another example (e.g., example 14) relates to a previously described example (e.g., example 13), wherein the system further includes a clock multiplier configured to multiply a filtered clock signal with a factor K, wherein the multiplied clock signal is injected into the observation ADC and the filtered clock signal is at a fraction (1/M) of the sampling clock of the main ADC, and K and M are coprime, wherein the duty cycle estimation block is configured to estimate the skew based on samples of the multiplied clock signal obtained by the observation ADC.

Another example (e.g., example 15) relates to a previously described example (e.g., any one of examples 13-14), wherein the observation ADC is one of sub-ADCs of the main ADC.

Another example (e.g., example 16) relates to a method for calibrating a time-interleaved DAC. The method includes generating calibration data, converting, by a time-interleaved DAC, the calibration data to an analog calibration signal, wherein the time-interleaved DAC includes two or more sub-DACs, filtering the analog calibration signal, sampling and quantizing, by an observation ADC, the filtered analog calibration signal, estimating a frequency response mismatch between the sub-DACs based on an output of the observation ADC, generating a sub-DAC mismatch correction factor based on the estimated frequency response mismatch, and applying the sub-DAC mismatch correction factor to the calibration data.

Another example (e.g., example 17) relates to a previously described example (e.g., example 16), wherein the method further includes estimating a DC offset mismatch between the sub-DACs based on the output of the observation ADC, generating a DC offset correction factor based on the estimated a DC offset mismatch, and applying the DC offset correction factor to the calibration data.

Another example (e.g., example 18) relates to a previously described example (e.g., any one of examples 16-17), wherein the time-interleaved DAC comprises two sub-DACs that are configured to operate using a clock of a main system and an inverted clock of the main system, respectively, and the observation ADC is configured to effectively sample the analog calibration signal at twice a rate of the clock of the main system by using multiple lower-rate clocks with different phases that are generated based on the clock of the main system and the inverted clock of the main system, the method further includes estimating a skew of the clock and the inverted clock based on the output of the observation ADC, and correcting an output of the observation ADC based on the estimated skew.

Another example (e.g., example 19) relates to a previously described example (e.g., example 18), wherein the main system is a time-interleaved ADC including M sub-ADCs, wherein M is an interleaving factor of the time-interleaved ADC, and the observation ADC is an additional sub-ADC of the time-interleaved ADC, and the observation ADC is configured to effectively sample the analog calibration signal at twice a sampling frequency of the time-interleaved ADC by using multiple lower-rate clocks with different phases that are generated based on a sampling clock of the main system and an inverted sampling clock of the main ADC, the method further includes filtering a system clock signal, multiplying the filtered system clock signal with a factor K, and injecting the multiplied system clock signal into the observation ADC, wherein the system clock signal is at a fraction (1/M) of a sampling clock of the time-interleaved ADC, and K and M are coprime, and the skew is estimated based on samples of the multiplied system clock signal obtained by the observation ADC.

Another example (e.g., example 20) relates to a non-transitory machine-readable storage including machine readable instructions, when executed, to implement a method as in any one of examples 16-19.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A system for calibrating a time-interleaved digital-to-analog converter (DAC), comprising:
   a calibration signal generator configured to generate calibration data;
   a time-interleaved DAC configured to convert the calibration data to an analog calibration signal, wherein the time-interleaved DAC includes two or more sub-DACs;
   an anti-alias filter configured to filter the analog calibration signal;
   an observation analog-to-digital converter (ADC) configured to sample, and quantize, the analog calibration signal filtered by the anti-alias filter; and
   a mismatch estimation block configured to estimate a frequency response mismatch between the sub-DACs and generate a sub-DAC mismatch correction factor based on an output of the observation ADC,
   wherein the calibration signal generator is configured to apply the sub-DAC mismatch correction factor to the calibration data.

2. The system of claim 1, wherein the mismatch estimation block is configured to estimate a DC offset mismatch between the sub-DACs based on the output of the observation ADC and generate a DC offset correction factor, wherein the calibration signal generator is configured to apply the DC offset correction factor to the calibration data.

3. The system of claim 1, wherein the time-interleaved DAC comprises two sub-DACs, and the two sub-DACs are configured to operate using a clock of a main system and an inverted clock of the main system, respectively.

4. The system of claim 1, wherein the observation ADC is configured to effectively sample the analog calibration signal at twice a clock rate of a main system by using multiple lower-rate clocks with different phases that are generated based on a clock of the main system and an inverted clock of the main system.

5. The system of claim 4, further comprising:
   a duty cycle estimation block configured to estimate a skew of the clock and the inverted clock based on the output of the observation ADC; and
   a duty cycle correction block configured to correct an output of the observation ADC based on the estimated skew, wherein the mismatch estimation block is configured to estimate the frequency response mismatch and generate the sub-DAC mismatch correction factor based on an output of the duty cycle correction block.

6. The system of claim 5, wherein the main system is a time-interleaved ADC including M sub-ADCs, wherein M is an interleaving factor of the time-interleaved ADC, and the observation ADC is an additional sub-ADC of the time-interleaved ADC, and the observation ADC is configured to effectively sample the analog calibration signal at twice a sampling frequency of the time-interleaved ADC by generating and using 2M lower-rate clocks with different phases based on a sampling clock of the time-interleaved ADC and an inverted sampling clock of the time-interleaved ADC.

7. The system of claim 6 further comprising:
   a clock multiplier configured to multiply a filtered clock signal with a factor K, wherein the multiplied clock signal is injected into the observation ADC and the filtered clock signal is at a fraction (1/M) of the sampling clock of the time-interleaved ADC, and K and M are coprime,
   wherein the duty cycle estimation block is configured to estimate the skew based on samples of the multiplied clock signal obtained by the observation ADC.

8. An analog-to-digital conversion system, comprising:
   a main analog-to-digital converter (ADC) configured to convert an analog input signal to a digital signal;
   a digital equalizer configured to remove a distortion incurred by the main ADC from an output of the main ADC;
   an equalizer coefficient estimation block configured to generate coefficients for the digital equalizer;
   a calibration signal generator configured to generate calibration data;
   a time-interleaved digital-to-analog converter (DAC) configured to convert the calibration data to an analog calibration signal, wherein the time-interleaved DAC includes two or more sub-DACs;
   an anti-alias filter configured to filter the analog calibration signal;
   an observation ADC configured to sample, and quantize, the analog calibration signal filtered by the anti-alias filter; and
   a mismatch estimation block configured to estimate a frequency response mismatch between the sub-DACs and generate a sub-DAC mismatch correction factor based on an output of the observation ADC,
   wherein the calibration signal generator is configured to apply the sub-DAC mismatch correction factor to the calibration data.

9. The system of claim 8, wherein the mismatch estimation block is configured to estimate a DC offset mismatch between the sub-DACs based on the output of the observation ADC and generate a DC offset correction factor, wherein the calibration signal generator is configured to apply the DC offset correction factor to the calibration data.

10. The system of claim 8, wherein the time-interleaved DAC comprises two sub-DACs, and the two sub-DACs are configured to operate using a sampling clock of the main ADC and an inverted sampling clock of the main ADC, respectively.

11. The system of claim 8, wherein the observation ADC is configured to effectively sample the analog calibration signal at twice a sampling frequency of the main ADC by using multiple lower-rate clocks with different phases that are generated based on a sampling clock of the main ADC and an inverted sampling clock of the main ADC.

12. The system of claim 11, further comprising:
a duty cycle estimation block configured to estimate a skew of the sampling clock and the inverted sampling clock based on the output of the observation ADC; and
a duty cycle correction block configured to correct an output of the observation ADC based on the estimated skew.

13. The system of claim 12, wherein the main ADC is a time-interleaved ADC including M sub-ADCs, wherein M is an interleaving factor of the time-interleaved ADC, and the observation ADC is an additional sub-ADC of the time-interleaved ADC, and the observation ADC is configured to effectively sample the analog calibration signal at twice the sampling frequency of the time-interleaved ADC by using multiple lower-rate clocks with different phases that are generated based on the sampling clock of the main ADC and the inverted sampling clock of the main ADC.

14. The system of claim 13 further comprising:
a clock multiplier configured to multiply a filtered clock signal with a factor K, wherein the multiplied clock signal is injected into the observation ADC and the filtered clock signal is at a fraction (1/M) of the sampling clock of the main ADC, and K and M are coprime,
wherein the duty cycle estimation block is configured to estimate the skew based on samples of the multiplied clock signal obtained by the observation ADC.

15. The system of claim 13, wherein the observation ADC is one of sub-ADCs of the main ADC.

16. A method for calibrating a time-interleaved digital-to-analog converter (DAC), comprising:
generating calibration data;
converting, by a time-interleaved DAC, the calibration data to an analog calibration signal, wherein the time-interleaved DAC includes two or more sub-DACs;
filtering the analog calibration signal;
sampling and quantizing, by an observation analog-to-digital converter (ADC), the filtered analog calibration signal;
estimating a frequency response mismatch between the sub-DACs based on an output of the observation ADC;
generating a sub-DAC mismatch correction factor based on the estimated frequency response mismatch; and
applying the sub-DAC mismatch correction factor to the calibration data.

17. The method of claim 16, further comprising:
estimating a DC offset mismatch between the sub-DACs based on the output of the observation ADC;
generating a DC offset correction factor based on the estimated a DC offset mismatch; and
applying the DC offset correction factor to the calibration data.

18. The method of claim 16, wherein the time-interleaved DAC comprises two sub-DACs that are configured to operate using a clock of a main system and an inverted clock of the main system, respectively, and the observation ADC is configured to effectively sample the analog calibration signal at twice a rate of the clock of the main system by using multiple lower-rate clocks with different phases that are generated based on the clock of the main system and the inverted clock of the main system, the method further comprising:
estimating a skew of the clock and the inverted clock based on the output of the observation ADC; and
correcting an output of the observation ADC based on the estimated skew.

19. The method of claim 18, wherein the main system is a time-interleaved ADC including M sub-ADCs, wherein M is an interleaving factor of the time-interleaved ADC, and the observation ADC is an additional sub-ADC of the time-interleaved ADC, and the observation ADC is configured to effectively sample the analog calibration signal at twice a sampling frequency of the time-interleaved ADC by using multiple lower-rate clocks with different phases that are generated based on a sampling clock of the main system and an inverted sampling clock of the main ADC, the method further comprising:
filtering a system clock signal;
multiplying the filtered system clock signal with a factor K; and
injecting the multiplied system clock signal into the observation ADC,
wherein the system clock signal is at a fraction (1/M) of a sampling clock of the time-interleaved ADC, and K and M are coprime, and the skew is estimated based on samples of the multiplied system clock signal obtained by the observation ADC.

20. A non-transitory machine-readable storage including machine readable instructions, when executed, to implement a method of claim 16.

* * * * *